United States Patent [19]

Pauly

[11] Patent Number: 5,023,471
[45] Date of Patent: Jun. 11, 1991

[54] TESTABLE INPUT/OUTPUT CIRCUIT FOR A LOAD DECOUPLED BY A TRANSFORMER

[75] Inventor: Jean Pauly, Lisses, France

[73] Assignee: Cegelec, Levallois-Perret, France

[21] Appl. No.: 457,677

[22] Filed: Dec. 27, 1989

[51] Int. Cl.$^5$ ............................................. H02J 13/00
[52] U.S. Cl. .................... 307/149; 323/909; 307/282
[58] Field of Search .................... 361/45, 49; 307/149, 307/253, 282, 314; 323/275, 285, 299, 303, 349, 351, 909; 324/601, 602, 612, 511, 537; 340/514

[56] References Cited

U.S. PATENT DOCUMENTS

| | | | |
|---|---|---|---|
| 4,041,327 | 8/1977 | Thomas | 307/231 |
| 4,420,700 | 12/1983 | Fay et al. | 307/571 |
| 4,661,880 | 4/1987 | Futsuhara | 361/93 |

FOREIGN PATENT DOCUMENTS 0046962 3/1982 European Pat. Off. .

Primary Examiner—A. D. Pellinen
Assistant Examiner—J. Gaffin
Attorney, Agent, or Firm—Sughrue, Mion, Zinn Macpeak & Seas

[57] ABSTRACT

An input/output circuit for performing tests prior to controlling an electrical load (2) which is decoupled by a transformer (5). An input (E) thereto acts on a first switching member (6) connected in series with a primary winding of the transformer in a power supply circuit for said primary winding. An output (S) provides a signal on the basis of the voltage present across the terminals of an output resistor (7) connected in series with the primary winding of the transformer in the power supply circuit of said winding. A second switching member (3) is inserted in series with the load in a power supply circuit for said load, and is controlled from the input to the input/output circuit via the transformer and a rectifier circuit (10) connected to the terminals of a secondary winding of the transformer. An impedance-switching circuit (13, 16) is connected to the terminals of the second winding in order to act on the input/output circuit by changing the voltage across the terminals of its output resistor. When power supply current flows through the second switching member, the impedance switching circuit is controlled to switch in an auxiliary impedance (17).

6 Claims, 5 Drawing Sheets

FIG. 3
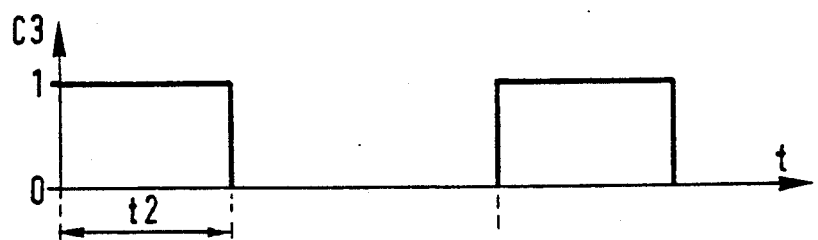
FIG. 3 A
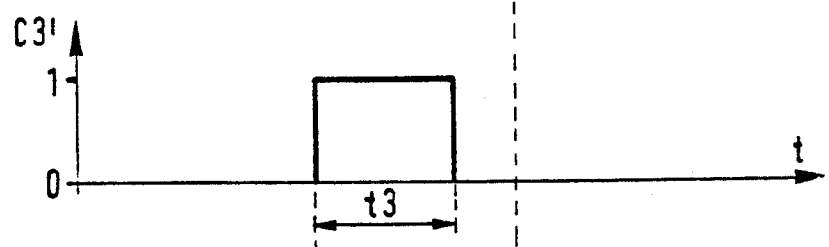
FIG. 3 B
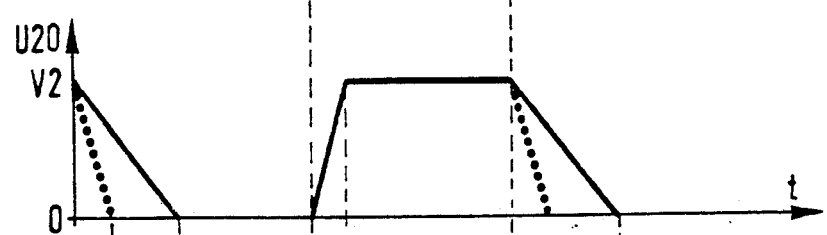
FIG. 3 C
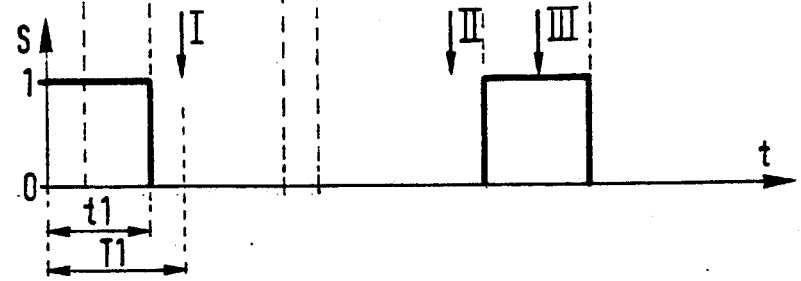
FIG. 3 D

FIG.5
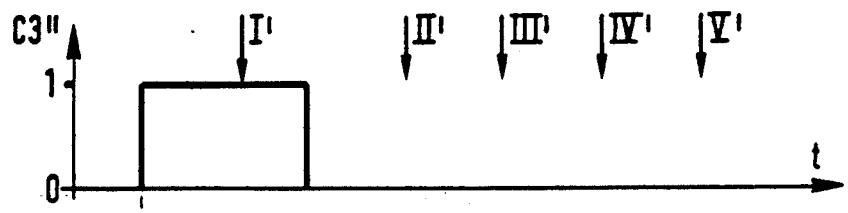
FIG.5 A
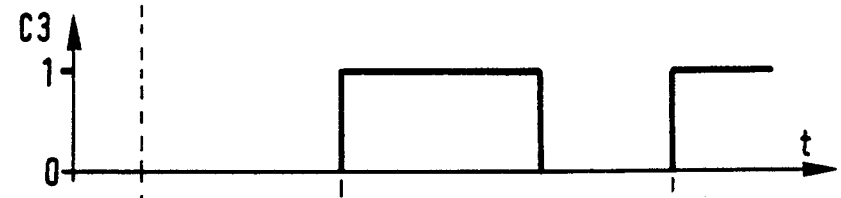
FIG.5 B
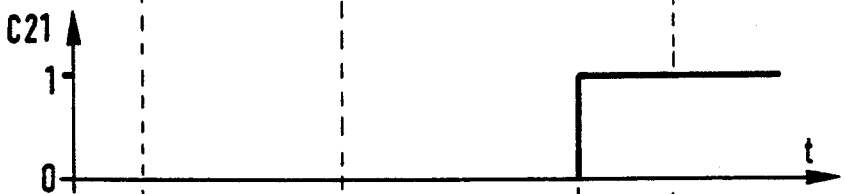
FIG.5 C
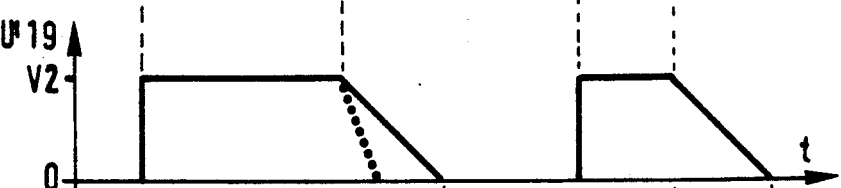
FIG.5 D
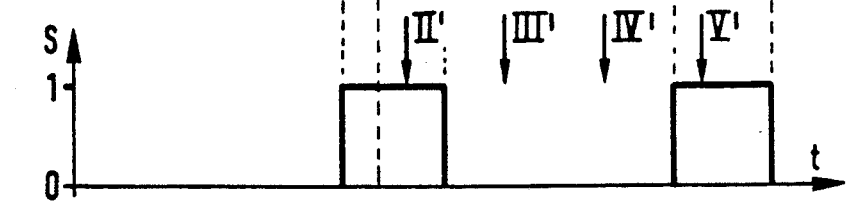
FIG.5 E

TESTABLE INPUT/OUTPUT CIRCUIT FOR A LOAD DECOUPLED BY A TRANSFORMER

The invention relates to a testable input/output circuit for a load decoupled by a transformer.

In numerous industrial applications, loads such as actuators, motors, etc., are remotely controlled electrically via transformers which isolate the loads and the associated switching members from the control logic that serves to operate them and supervise them.

Control logic circuits and/or operators do not always have the possibility of determining directly whether instructions transmitted via transformers produce the expected results, and as a result efforts are made in remotely controlled equipments to provide means suitable for producing and transmitting return signals corresponding to the results actually obtained.

In some situations it is also advantageous, prior to issuing an instruction, to be able to verify that the controlled equipment is in a state suitable for performing an instruction, without actually issuing the instruction.

The present invention therefore proposes a testable input/output circuit for a load which is decoupled by a transformer.

According to a characteristic of the invention, the input/output circuit designed to make prior testing possible and to control the power supplied to a load, comprises:

an input acting on a first switching member connected in series with a primary winding of the transformer in a power supply circuit for said primary winding, referred to as the "first" circuit, and controlled by the first switching member;

an output providing a signal from the voltage present across the terminals of an output resistor connected in series with the primary winding of the transformer in the power supply circuit for said winding;

a secondary circuit including a second switching member which is inserted in series with the load in a power supply circuit for said load, referred to as the "second" circuit and under the control of the second switching member, which switching member is controlled from the input of the circuit via the transformer and a rectifier circuit connected to the terminals of a secondary winding of said transformer, said secondary circuit further including an impedance-switching circuit which is responsive to power supply current flowing through the second switching member and which is suitable for responding thereto by switching an auxiliary impedance to the terminals of the second winding in order to act on the output of the input/output circuit by changing the voltage across the terminals of the output resistor.

FIGS. 3A to 3D are waveform diagrams relating to testing the input/output circuit of FIG. 2.

FIGS. 5A to 5E are waveform diagrams relating to testing an input/output circuit as shown in FIG. 4.

Figure 1:
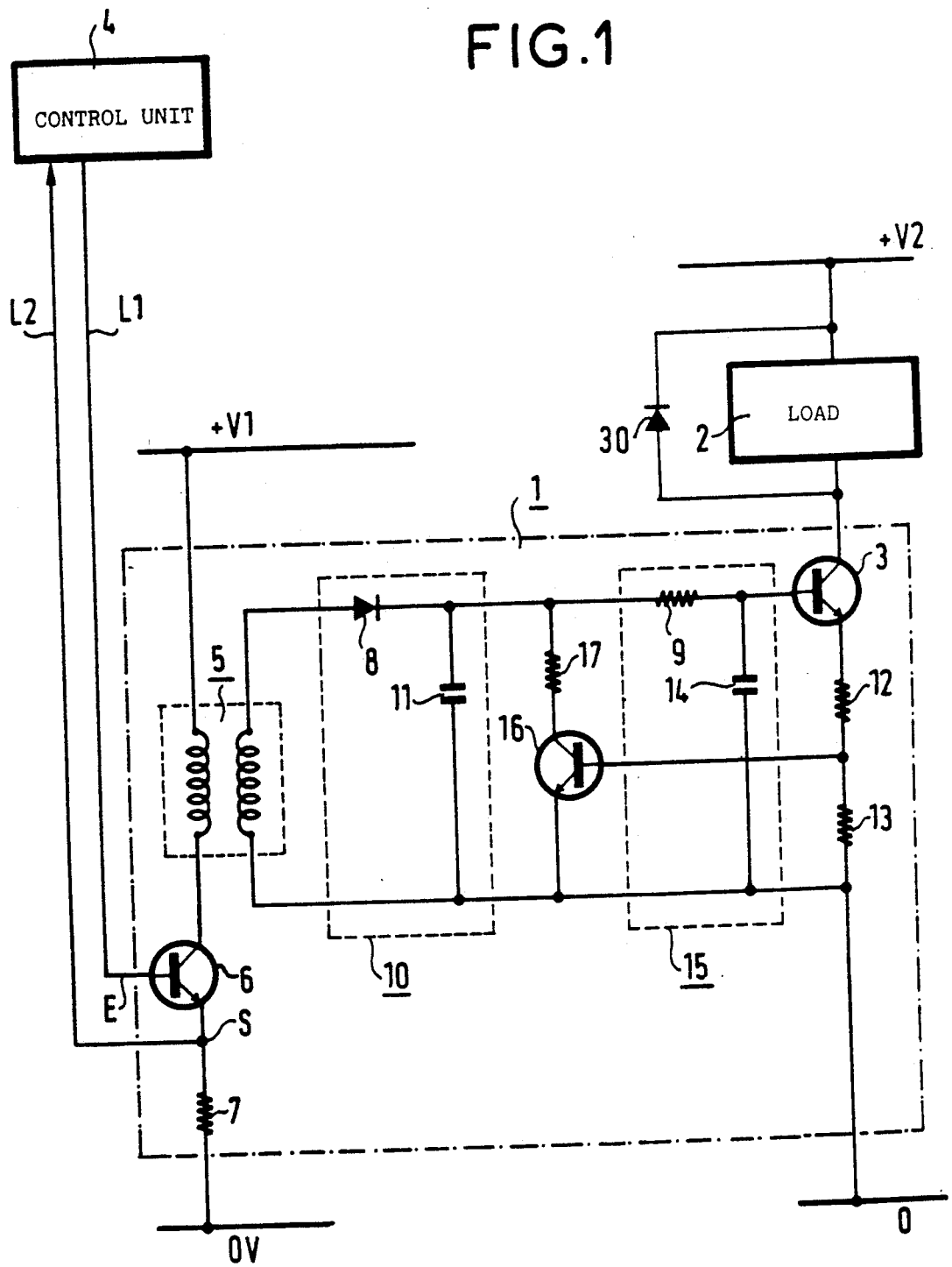
FIG. 1 is a circuit diagram of a testable input/output circuit of the invention for a load decoupled by a transformer.

The testable input/output circuit 1 shown in FIG. 1 is intended to serve a load 2 constituted, for example, by the winding of a contactor, by an electrically controlled valve, by a motor, or by some other device said load being assumed to be inductive and being conventionally provided with surge protection by a diode 30.

The supply of electrical power to the load 2 is controlled by an activation switching member 3, symbolized in this case by a first NPN transistor. The switching member 3 is controlled, in this case via the base of the transistor, from a control unit 4 via a separating transformer 5 which is included in this case in the testable input/output circuit 1. The control unit 4 is of the logic type, and is organized, for example, about a processor (not shown) which issues instructions and which processes reports following its instructions. Data interchanges take place over appropriate interfaces and under the control of a program recorded in memories associated with the processor.

Instructions are transmitted to the primary winding of the transformer 5 via a switching member 6 represented by a second activation NPN transistor which is conventionally controlled via its base E over a link L1. The control signal may be a 2 MHz signal, for example, delivered by an appropriate interface of the control unit 4 and activated when the switching member 3 is to be activated to supply electrical power to the load 2.

The primary winding of the transformer 5 and the switching member 6 are connected in series between D.C. power supply potentials, e.g. +VI and 0V, via a current-limiting resistor 7 which is connected, in this case, between the emitter of the transistor and the 0V potential.

The output point S common to said transistor emitter and the resistor 7 provides the control unit with a signal over a link L2 indicative of the value of the current flowing through the primary winding of the transformer 5 the collector-emitter circuit of the transistor, and the resistor 7.

A secondary winding of the transformer 5 serves to transmit control signals to the switching member 3, and in the example shown here, one terminal of this winding is connected via a diode 8 and a resistor 9 to the base of the first activation transistor constituting the switching member 3.

The diode 8 constitutes a portion of a rectifier circuit 10 which also includes, in this case, a capacitor 11 connected in parallel with the circuit constituted by the secondary winding of the transformer 5 and the diode 8 connected in series.

The rectified current delivered by the rectifier circuit 10 when a 2 MHz control signal is applied to the second activation transistor is in turn applied to the base of the first activation transistor in order to switch it on, thereby powering the load 2. To this end, the load is connected in series with the collector-emitter circuit of the first activation transistor and with two resistors 12 and 13 between power supply potentials referred to herein as +V2 and 0. The potential different across the terminals of these series-connected components is often much greater than that present across the terminals of the circuit constituted by the series connection of the primary winding of the transformer 5, the switching member 6, and the resistor 7.

The resistor 9 is associated with a capacitor 14 in order to form a timing circuit 15 in which the capacitor is connected between the point common to the resistor 9 and the base of the first activation transistor, and the end of the resistor 13 which is connected to the potential 0.

The collector-emitter circuit of an NPN type transistor 16 is connected in series with a resistor 17 in a branch which is connected in parallel with the capacitor 11 between the cathode of the diode 8 and the potential 0.

When a supply power instruction is sent by the control unit 4 to the switching member 6, said second activation transistor is caused to conduct, thereby causing current to flow through the circuit branch constituted by the primary winding of the transistor 5, the second transistor, and the resistor 7. Link L2 enables the control unit 4 to detect the existence of and the value of the voltage generated across the terminals of the resistor 7 in response to the instruction it has issued, and consequently enables it to test continuity or lack of continuity in the circuit branch including the primary winding of the transformer. By monitoring the voltage across the terminals of the resistor 7, which voltage is a function of the current flowing through the primary winding of the transformer 5, it is also possible to detect any failure in the input/output circuit that gives rise to an abnormal change in impedance, and thus to an abnormal change in current.

The current set up in the secondary winding of the transformer 5 is applied to the base of the first activation transistor after being rectified by the circuit 10, and under normal circumstances it causes said transistor to switch into the ON state, thereby powering the load 2.

Current thus flows through the divider bridge constituted by the series connected resistors 12 and 13, thereby biasing the base of the transistor 16 so that it too switches ON.

The resistor 17 whose resistance may be about one hundred fifty ohms, for example, is then connected in parallel with the terminals of the secondary winding of the transformer 5, thereby changing the impedance of the secondary winding as seen from the primary winding and consequently changing the current which flows through the resistor 7 This change is detected at point S and is taken into account by the control unit 4 over link L2. The control unit 4 is thus capable of discovering whether an instruction it has issued is indeed performed.

It is also possible to verify the control circuit of the switching unit 3 without switching on the load 2. To this end, the control signal delivered to the transformer 5 is limited to a single narrow pulse. This pulse is normally absorbed by the timing circuit 15 constituted, for example, by the resistor 9 and the capacitor 14.

It therefore has no effect on the switching member 3 unless a possible fault thereon causes it to conduct and consequently causes the transistor 16 to conduct.

In this case, conduction of the transistor 16 changes the impedance present on the secondary winding of the transformer 5, thereby briefly influencing the current flowing through the primary winding of the transformer and thus the voltage across the terminals of the resistor 7 The control unit 4 is therefore informed of the modification over the link L2, and is therefore in a position to take the necessary measures.

Figure 2:
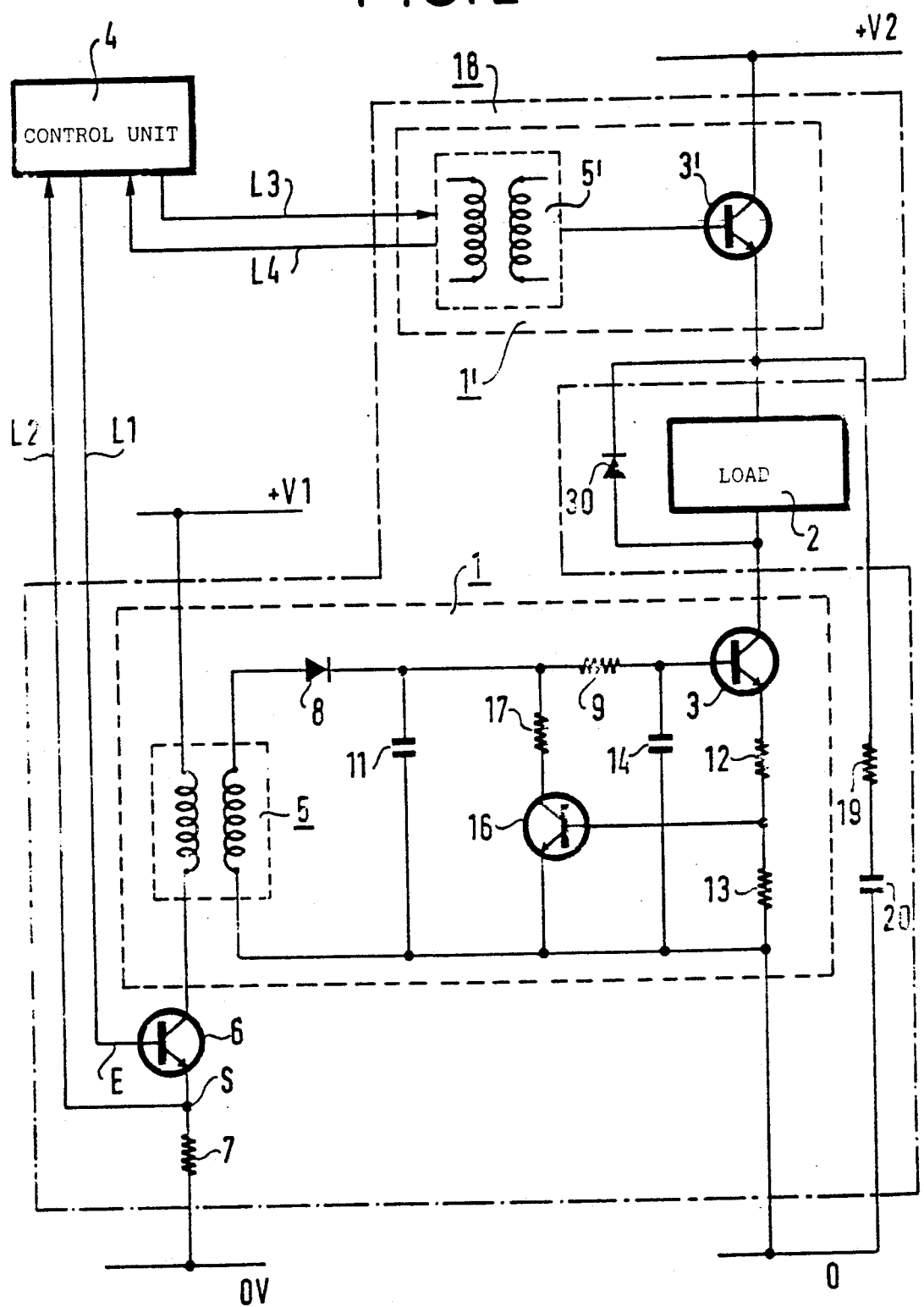
FIG. 2 is a circuit diagram of a variant of the circuit shown in FIG. 1

The circuit shown in FIG. 2 constitutes a variant usable in cases where the switching member 3 controlling the supply of power to the load 2 is duplicated for security reasons by a switching member 3' situated on the other side of the load 2 and integrated in a circuit 1' identical to the above-described input/output circuit 1. For example, the circuit 1' is actuated and supervised by the control unit 4 over links L3 and L4 analogous to the links L1 and L2, and it is organized about a transformer 5' which is connected similarly to the transformer 5. The assembly constituted by the circuit 1' and the circuit 1 constitutes a novel testable input/output circuit 18 incorporating a series RC circuit comprising a resistor 19 and a capacitor 20 connected between the potential 0 and the emitter of transistor 3', in parallel with the circuit branch constituted by the load 2, the emitter-collector circuit of the transistor 3, and the series connected resistors 12 and 13.

In accordance with the invention, the complete operation of the circuit including the load and the switching members 3 and 3' is monitored by monitoring the operation of their respective control circuits in the manner mentioned above with reference to FIG. 1 and without switching on the load.

To this end, the control unit 4 initially actuates the switching member 6 by applying a single pulse of a 2 MHz signal thereto with the duration of the pulse corresponding to the duration of the first binary one pulse appearing in FIG. 3A.

The switching member 3 is then switched ON for the duration of the first pulse during the period shown in FIG. 3A. This figure shows the periods during which the switching member 3 is switched ON, corresponding to a binary level "one" in the diagram, and in which it is switched OFF, corresponding to a binary level "zero".

Simultaneously, the switching member 3' remains in the OFF state, since no activation control is applied by the control unit 4 over the link L3 (FIG. 3B).

If the capacitor 20 had previously been charged by the switching member 3' being connected to the potential +V2, then it discharges by virtue of the switching member 3 being in the ON state, unless the switching member 3' has remained in the ON state due to a failure.

The transistor 16 switched ON by the current flowing through the circuit branch constituted by the switching member 3 and the series connected resistors 12 and 13, and it causes the primary current flowing through the primary winding of the transformer 5 to take account of the resistor 7 being connected in the circuit connected to the secondary winding of the transformer.

This primary current sets up a voltage across the terminals of the resistor 7 which can be detected by the control unit and which is represented by a binary level in the diagram of FIG. 3D.

The voltage U20 across the terminals of the capacitor 20 as shown in FIG. 3C reduces from the moment the connection member 3 is switched on and until it has discharged completely which takes a period of time that may be very short if the load is short-circuited due to a failure (dotted line). When it stops discharging, the resistor 17 is disconnected from the transformer 5, thereby reducing its primary current which is equivalent to a zero level binary signal at the output point S and on the corresponding diagram of FIG. 3D.

The control unit 4 performs a first measurement I at output point S over link L2 after time T1 has elapsed which is greater than the normal discharge time t1 of the capacitor 20 through the circuit branch comprising the load 2 and the resistors 12 and 13.

The presence of a binary "one" level at output point S after measurement I means that current is flowing through switching member 3' which is therefore ON, and short-circuited. Such a fault is normally detected by the said circuit 1' prior to being detected at point R of circuit 1, insofar as the circuit 1', like the input/output circuit 1 described with reference to FIG. 1, is capable of prior verification of the state of the switching member 3'.

After a period of time t2>T1, the end of the control signal on link L1 destined for switching member 3 via the transformer 5 normally causes the switching member to switch to the OFF state, thereby allowing a new test stage to be run during which the switching member 3' is switched ON in turn by a control signal of the same type as that applied to the switching member 3.

This control signal is shown in FIG. 3B and causes the capacitor 20 to charge so its voltage increases for a period t3 until it reaches a limiting value shown in FIG. 3C, with the control signal preferably being maintained for only a limited period of time t3 after the end of the time allowed for the capacitor 20 to charge.

A second measurement II is then performed at output point S after the end of the control signal for switching member 3'.

This second measurement normally gives rise to a zero level being detected, unless the switching member 3 is ON due to a fault, thereby causing the resistor 17 to be connected in the secondary circuit of the transformer 5. However, such a fault is normally detected earlier for the reasons mentioned above with respect to a fault in switching member 3'.

The switching member 3 is then controlled again by the control unit 4 over the link L1 in order to switch said member back ON. The capacitor 20 then discharges via the load 2 and the resistors 12 and 13, unless the switching member 3 was previously ON because of a fault.

A third measurement III is performed at output point S under the control of the control unit 4 at an arbitrary instant during a period of time corresponding to the normal discharge of the capacitor 20. The output point S is normally at binary level one, unless the switching member 3 was previously ON due to a fault.

The combination of measurements I, II, and III performed successively during a single test operation serves to determine whether the input/output circuit is in a normal state which gives rise to the combination zero, zero, one for the three successive measurements I, II, and III, with any other combination being indicative of a fault which the succession of measurements serves to locate. This means that a full test can be performed before operation, it being understood that any search for causes of an observed fault is normally performed away from the installation after the circuit concerned has been removed.

Figure 4:
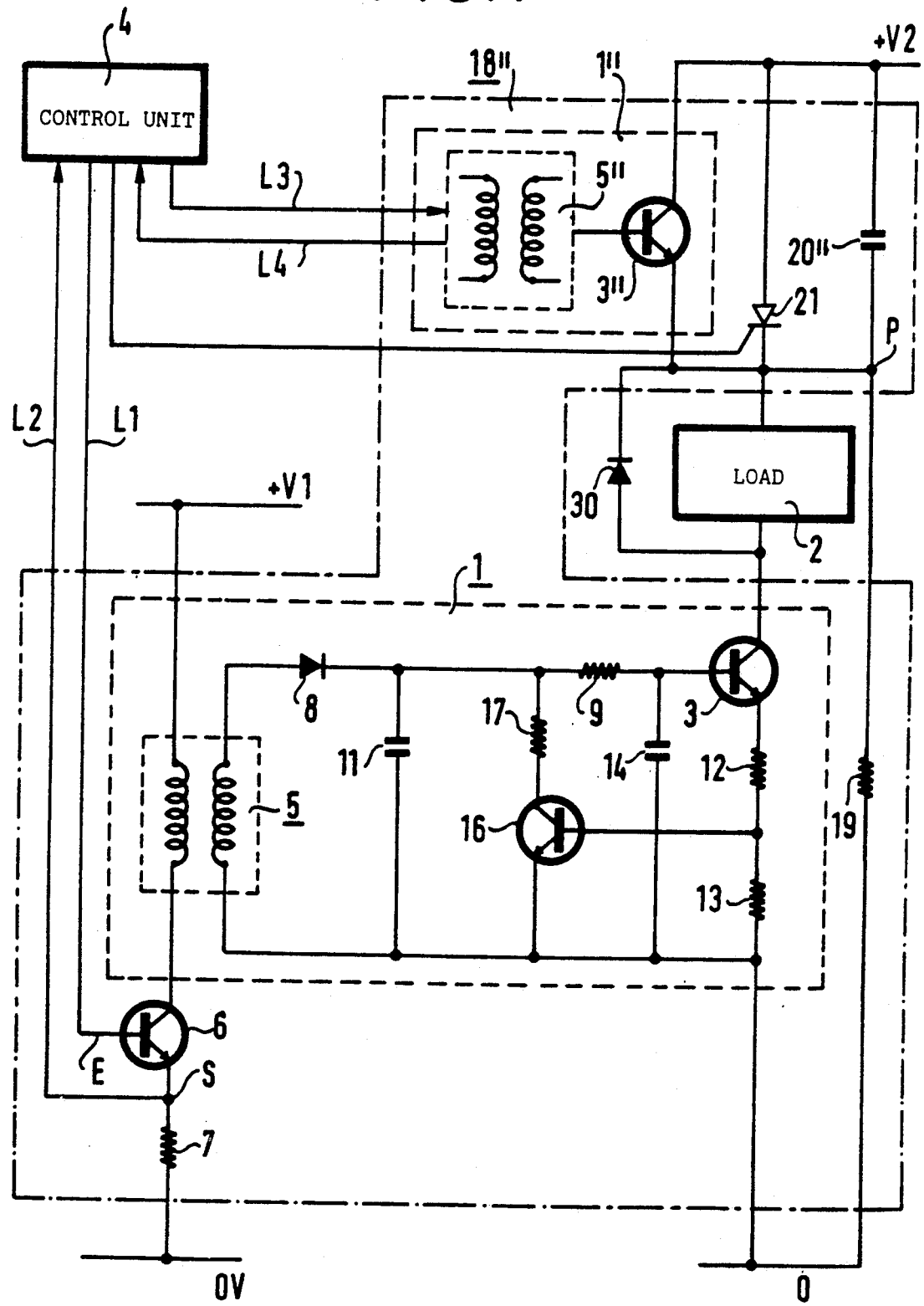
FIG. 4 shows a variant of the circuit shown in FIG. 2.

The circuit shown in FIG. 4 comprises a variant over that shown in FIG. 2, and adapted to the case when the switching member 3' is constituted by a power thyristor in parallel with a transistor 3" which serves to short-circuit the thyristor during extinction.

In such circuits, it is conventional to place a capacitor 20" in parallel with the anode-cathode junction of the thyristor 21 in order to absorb surges, and the trigger of the thyristor is under the control of the control unit 4.

The resistor 19 can then be connected to the point P common to the capacitor 20", to the cathode of the thyristor 21, and to the emitter of the transistor 3", on the opposite side of the load 2 to switching member 3.

As above, the full operation of the circuit including its load can be checked without running the risk of activating the load.

To this end, during a first stage, the control unit 4 switches on the transistor 3" which causes a binary level one signal shown in FIG. 5A to appear while the thyristor 21 and the switching member 3 are kept in the OFF state which causes binary value zero signals to appear as shown in diagrams 5B and 5C. This causes the potential V2 to be applied to the point P which is common to the resistor 19 and the capacitor 20" (FIG. 5D).

A first measurement I' performed during this stage gives rise to a binary level zero at the output S (FIG. 5E) unless the switching member 3 is ON due to a fault.

During a second stage and after the switching member 3" has returned to the OFF state under control of the control unit 4, the switching member 3 is switched ON, thereby discharging the capacitor 20" through the load 2 and returning the potential of point P to level zero during a period of time which is a function of the load 2 and of the diode 30.

A measurement II' performed after the switching member 3 has been switched ON and before the end of the normal time taken by the capacitor 20" to discharge through the load 2 and the resistors 12 and 13 gives rise to a binary level one signal at the output S, unless the load 2 is open circuit (dotted line in FIG. 5D) or possibly short-circuited via the diode 30 (dashed line in FIG. 5D).

A measurement III' taken after sufficient time has elapsed to enable the capacitor 20 to discharge under normal circumstances serves to verify that neither the transistor 3" nor the thyristor 21 are conductive due to a fault.

By switching ON thyristor 21 after switching OFF switching member 3, the point P is returned to the potential +V2 without having any effect on the output S of the input/output circuit 18 unless the switching member 3 is ON due to a fault (FIGS. 5C to 5E).

Subsequent activation of the switching member 3 (FIG. 5A) causes the tension of point P to drop progressively over a period of time which varies as a function of the load 2 and of the diode 30, said period varying between a very short length of time if the load 2 is short-circuited, optionally via the diode 30, to a very long period of time if the load is open circuit.

A measurement V' performed within the normal period of time for the capacitor 20" to discharge through the load 2 and the resistors 12 and 13 after the switching member has had an ON instruction applied thereto (FIG. 5B) serves to verify, in conjunction with the preceding measurement, whether the load 2, the thyristor 21, and the switching member 3 are in an appropriate operating condition. Rapidly short-circuiting the thyristor may optionally make it possible to avoid triggering the switching ON of the load should that be necessary.

As before, by combining the results of the measurements it is possible to determine where a fault is located prior to putting the load into service, thereby avoiding the drawbacks associated with attempts made under abnormal conditions.

I claim:

1. An input/output circuit for prior testing and control of an electrical load (2) decoupled by a transformer (5), the circuit being characterized in that it comprises:
   an input (E) acting on a first switching member (6) connected in series with a primary winding of the transformer in a power supply circuit for said primary winding, referred to as the "first" circuit, and controlled by the first switching member;
   an output (S) providing a signal from the voltage present across the terminals of an output resistor (7)

connected in series with the primary winding of the transformer in the power supply circuit for said winding;

a secondary circuit including a second switching member (3) which is inserted in series with the load in a power supply circuit for said load, referred to as the "second" circuit and under the control of the second switching member, the second switching member is controlled from the input of the circuit via the transformer and a rectifier circuit (10) connected to the terminals of a secondary winding of said transformer, said secondary circuit further including an impedance-switching circuit (13, 16) which is connected to the second switching member and is responsive to power supply current flowing through the second switching member, the second switching member responding thereto by switching an auxiliary impedance (17) to the terminals of the second winding in order to act on the output of the input/output circuit by changing the voltage across the terminals of the output resistor.

2. An input/output circuit according to claim 1, characterized in that the impedance-switching circuit includes a transistor (16) whose base is connected to the midpoint of a two resistor divider (12, 13) inserted in series with the load (2) and the second switching member (3) in the power supply circuit for said load, said transistor (16) being suitable, when activated, for connecting an auxiliary resistance (17) to the terminals of the secondary winding of the transformer.

3. An input/output circuit according to claim 1, characterized in that it includes a timing circuit (19, 14) connected upstream from the control input to the second switching member (3) and downstream from the impedance-switching circuit, relative to the secondary winding of the transformer.

4. An input/output circuit according to claim 2, including a third switching member (3') inserted in the power supply circuit of the load (2) on the other side of said load (2) relative to the second switching member (3), the input/output circuit being characterized in that it includes a test circuit constituted by a resistor (19) and a capacitor (20) connected in series and forming a series circuit connected in parallel with the circuit constituted by the load, the switching circuit and the voltage divider downstream from the third switching member.

5. An input/output circuit according to claim 2, including a third switching member which is inserted in the power supply circuit of the load (2) on the opposite side of the load (2) from the second switching member (3), the third switching member being constituted by a thyristor (21) having a capacitor (20") and a transistor (3") connected in parallel therewith for short-circuiting its anode-cathode junction, the input/output circuit being characterized in that it includes a test circuit associating a resistor (19) in series with the capacitor (20") between the power supply potentials for said load (2).

6. An input/output circuit according to claim 2, characterized in that it includes a timing circuit (19, 14) connected upstream from the control input to the second switching member (3) and downstream from the impedance-switching circuit, relative to the secondary winding of the transformer.

* * * * *